United States Patent
Bagnall et al.

(10) Patent No.: US 9,319,049 B2
(45) Date of Patent: Apr. 19, 2016

(54) METHOD AND APPARATUS FOR COMPENSATING A FREQUENCY GENERATOR SUCH AS AN OSCILLATOR FOR FREQUENCY INACCURACIES

(71) Applicant: STMicroelectronics (Research & Development) Limited, Marlow, Buckinghamshire (GB)

(72) Inventors: Peter Bagnall, Bath (GB); Philip Mattos, Ruardean Woodside (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 14/572,331

(22) Filed: Dec. 16, 2014

(65) Prior Publication Data
US 2015/0180480 A1   Jun. 25, 2015

(30) Foreign Application Priority Data

Dec. 20, 2013   (GB) .................................. 1322748.3

(51) Int. Cl.
*H03L 1/02*     (2006.01)
*G01S 19/23*    (2010.01)
*H03L 1/00*     (2006.01)

(52) U.S. Cl.
CPC .................. *H03L 1/00* (2013.01); *G01S 19/235* (2013.01); *H03L 1/026* (2013.01); *H03L 1/027* (2013.01)

(58) Field of Classification Search
CPC ......... G01S 19/23; G01S 19/235; H03B 5/30; H03B 5/32; H03L 1/00; H03L 1/02; H03L 1/022; H03L 1/023; H03L 1/025; H03L 1/026; H03L 1/027; H03L 1/028

USPC .................................... 331/44, 154, 158, 176
See application file for complete search history.

(56) References Cited

U.S. PATENT DOCUMENTS

| | | | |
|---|---|---|---|
| 5,654,718 A | 8/1997 | Beason et al. | |
| 5,740,525 A * | 4/1998 | Spears ................... | H03J 1/0033 455/196.1 |
| 5,893,044 A * | 4/1999 | King ....................... | G01S 19/24 342/357.43 |
| 6,522,212 B1 * | 2/2003 | Kodim ..................... | H03B 5/04 331/116 R |
| 6,636,121 B2 * | 10/2003 | Barak ...................... | H03L 1/026 331/158 |
| 6,757,527 B1 * | 6/2004 | Dahlback .................. | H03J 7/04 331/176 |
| 7,015,762 B1 | 3/2006 | Nicholls et al. | |
| 7,148,761 B1 * | 12/2006 | Shieh ....................... | H03L 1/026 331/158 |
| 7,466,209 B2 * | 12/2008 | Babitch ..................... | G01K 7/32 331/158 |
| 8,031,024 B1 * | 10/2011 | Zaslavsky ............... | H03L 1/026 331/158 |

(Continued)

OTHER PUBLICATIONS

UK—IPO Search Report for GB 1322748.3 mailed Jul. 31, 2014 (4 pages).

*Primary Examiner* — Levi Gannon
(74) *Attorney, Agent, or Firm* — Gardere Wynne Sewell LLP

(57) ABSTRACT

An input receives a generated frequency having a first frequency component and a second frequency component. A filter block includes filter coefficients describing a relationship between the second frequency component and an environmental characteristic. The filter block predicts the first frequency component based on the environmental characteristic, and updates the filter coefficients based on an offset between the predicted first frequency component and a received frequency corresponding to the first frequency component.

17 Claims, 6 Drawing Sheets

(56) References Cited

U.S. PATENT DOCUMENTS

| | | | | |
|---|---|---|---|---|
| 9,000,855 B2 * | 4/2015 | Huang | ............... | H03L 1/027 331/158 |
| 2002/0158700 A1 * | 10/2002 | Nemoto | ............... | H03B 5/04 331/158 |
| 2005/0093638 A1 * | 5/2005 | Lin | ............... | H03L 1/026 331/176 |
| 2005/0260961 A1 | 11/2005 | Cowley et al. | | |
| 2011/0086606 A1 | 4/2011 | Chen et al. | | |
| 2013/0033800 A1 | 2/2013 | Bartnik et al. | | |

* cited by examiner

METHOD AND APPARATUS FOR COMPENSATING A FREQUENCY GENERATOR SUCH AS AN OSCILLATOR FOR FREQUENCY INACCURACIES

PRIORITY CLAIM

This application claims priority from Great Britain Application for Patent No. 1322748.3 filed Dec. 20, 2013, the disclosure of which is incorporated by reference.

TECHNICAL FIELD

The present application relates to compensating for environmental effects and in particular but not exclusively to compensating a generated frequency for components caused by environmental factors such as temperature.

BACKGROUND

In global navigation satellite systems (GNSS) such as the global positioning system (GPS) or Galileo, satellites broadcast signals which may be used by a GNSS receiver to determine a position of a GNSS receiver.

In order to determine position, a receiver must first acquire a signal being broadcast from a satellite and then track that signal. In acquisition, the receiver acquires a difference in phase between a signal being broadcast from the satellite and a signal generated at the receiver. This phase difference corresponds to a time taken for the signal to propagate from the satellite to the receiver and thus the position of the receiver with respect to the satellite. Once a signal is acquired, this difference in phase may be tracked.

The acquisition and tracking of signals from four or more satellites and hence the relevant position of the receiver with respect to those satellites, allows a receiver to pinpoint its position. It will of course be appreciated, that in some case, some of the signals acquired and tracked may have terrestrial origins.

In order to acquire the satellite signal, a local signal is generated in order to determine a phase difference with the satellite signal. Any frequency error in the locally generated signal leads to an increase in the time taken to acquire the satellite signal as the receiver has to search not only for a phase difference but also potential frequency differences.

The accuracy of a frequency generator, such as a crystal oscillator, at the receiver may affect the speed and accuracy of the navigation system.

SUMMARY

According to a first aspect, there is provided an apparatus comprising: an input for receiving a generated frequency having a first frequency component and a second frequency component; a filter block having filter coefficients describing a relationship between the second frequency component and an environmental characteristic, the filter configured to: predict the first frequency component based on the environmental characteristic; and update the filter coefficients based on an offset between the predicted first frequency component and a received frequency corresponding to the first frequency component.

The filter may be a Kalman filter. The environmental characteristic may be an indication of the temperature at which the generated frequency is generated. The first frequency component may be an ideal frequency component. The second frequency component may be a non-ideal frequency component. The second frequency component may be a frequency component caused by non-ideal environmental characteristics.

The filter may be configured to update the coefficients in real time. The coefficients may be updated in response to receiving an indication of the environmental characteristic. The received frequency may be the frequency of a signal received from an external frequency generator and corresponds to the first frequency component. The received frequency may form part of a global navigation satellite system signal. The received frequency may be received from a global navigation satellite system transmitter.

The second frequency component may be caused by a non-ideal behavior of an oscillator due to temperature. The second frequency component may be further caused by a non-ideal relationship between the behavior of a thermistor providing the indication of temperature and the temperature at which the generated frequency is generated.

The filter coefficients may be configured to describe a relationship between the second frequency component and an indication of temperature based on the behavior of an oscillator and a thermistor in response to temperature.

The filter block may comprise: a first filter having coefficients describing a contribution to the second frequency component by an oscillator in response to temperature; and a second filter having coefficients describing the contribution to the second frequency component by a thermistor in response to temperature.

According to a second aspect, there is provided a device comprising: the apparatus of the first aspect; an oscillator; and an environmental sensor configured to measure the environmental characteristic of the oscillator.

The device may be a global navigation satellite system receiver.

According to a third aspect, there is provided a method comprising: receiving a generated frequency having a first frequency component and a second frequency component; predicting by a filter block the first frequency component of the generated frequency based on an environmental characteristic wherein the filter block comprises filter coefficients describing a relationship between the second frequency component and the environmental characteristic; and updating the filter coefficients based on an offset between the predicted first frequency component and a received frequency corresponding to the first frequency component.

BRIEF DESCRIPTION OF THE DRAWINGS

Embodiments will be described with reference to the following figures, in which.

DETAILED DESCRIPTION OF THE DRAWINGS

Figure 1:
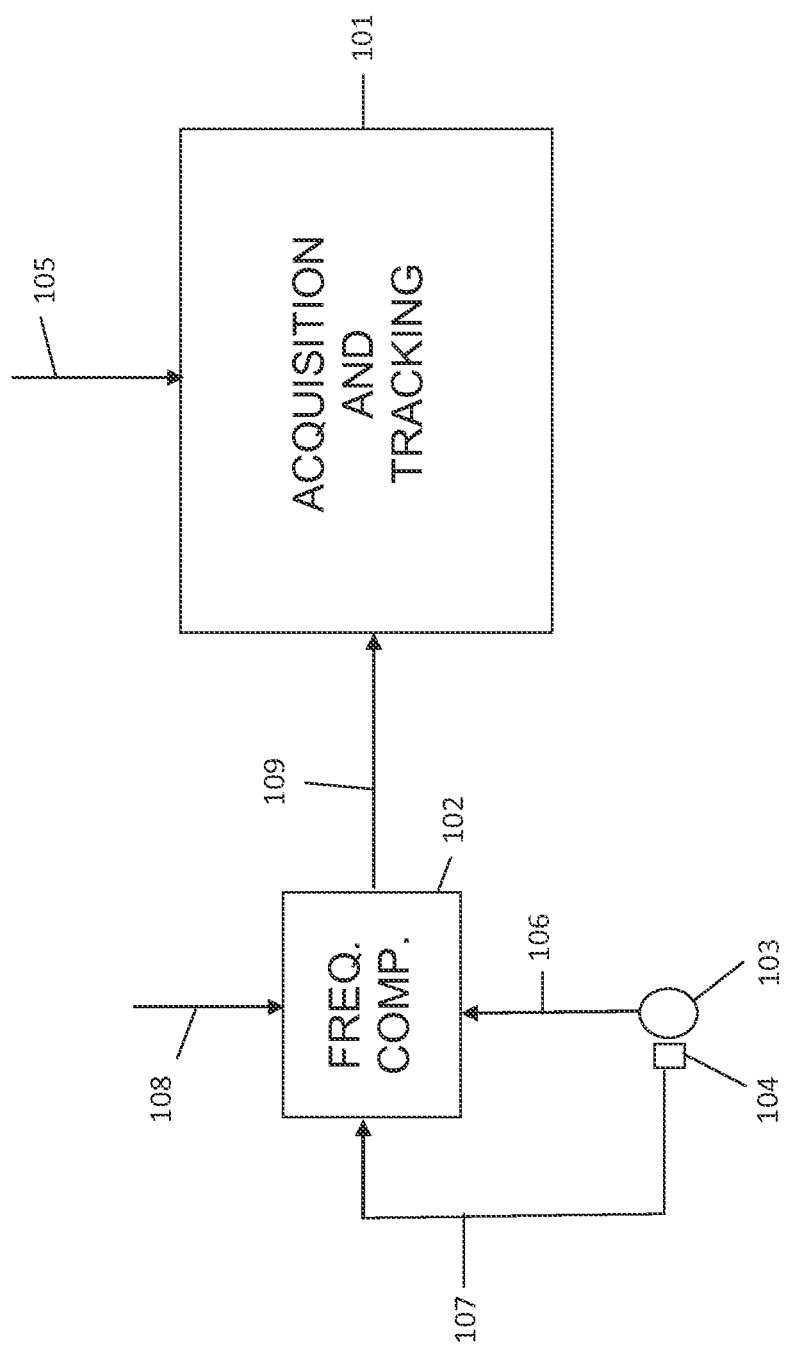
FIG. 1 is a schematic diagram depicting a receiver of some embodiments.

A signal may be generated locally at a GNSS receiver through use of a crystal oscillator. However such oscillators are not always robust in terms of generating a stable frequency in all conditions. For example the frequency generated by an oscillator at a receiver may be affected by the temperature of the receiver. Some systems try to correct this inaccuracy through hardware, for example by implementing a temperature controlled crystal oscillator (TCXO). A TCXO may have some capabilities to adjust a frequency generated by the oscillator based on temperature. This may help to mitigate the effects of external conditions (such as temperature) on the frequency accuracy of an oscillator.

The component cost of TCXOs however may contribute to the overall cost of the system. The more accurate an oscillator is, the more expensive it may be considered to be. Additionally such oscillators may require additional hardware and may contribute to an overall size of the receiver.

Embodiments of the present application are directed towards a method and apparatus for compensating a frequency generator such as an oscillator for frequency inaccuracies. These inaccuracies may be compensated for using an algorithm that is, for example, implemented in software. The frequency inaccuracies may be a result of, for example, environmental factors such as temperature. Additionally or alternatively, the frequency errors may be due to the inaccuracy of the oscillator itself.

In some embodiments other inaccuracies of hardware associated with the frequency compensator may be compensated for. For example a temperature of an oscillator may be measured by a thermistor and non-linearity in the relationship between the thermistor measurement and temperature may be additionally or alternatively compensated for.

In embodiments, a model that models a relationship between an indication of temperature and a frequency generated by the oscillator may be used. The model may provide an indication of non-ideal behavior of the oscillator caused by temperature. This model may be used to determine a compensation to be applied to the frequency generated by the oscillator to provide a frequency compensated for any non-ideal behavior of the oscillator.

An offset between the compensated frequency and a target frequency of the oscillator may be determined. This offset may be used to update the model in order to bring the compensated frequency closer to the target frequency.

The frequency compensated for non-ideal behavior of the oscillator may be considered to be a prediction of the frequency the oscillator would generate under ideal conditions. The target frequency can be considered to be the frequency that the oscillator is expected to generate under ideal conditions. In embodiments a predicted frequency is compared to a target frequency to determine an offset and this offset may be used to improve the accuracy of the predicted frequency.

In some embodiments, the frequency compensation may take place in or be associated with a GNSS receiver. The oscillator may be configured to generate a frequency to be used in the acquisition and/or tracking of a GNSS signal. The target frequency may be considered to be the frequency of the GNSS signal and the frequency generated by the oscillator may be compensated to provide a predicted frequency.

FIG. 1 shows an example of a GNSS receiver including a frequency compensator 102. It will be appreciated that in some embodiments, the frequency compensation may be implemented in software. For example, the frequency may be compensated in software and at least part of the tracking and acquisition functionality of the receiver 100 may be carried out in software.

FIG. 1 shows a GNSS receiver 100 having an acquisition and tracking block 101 and a frequency compensator 102. The receiver 100 may further include an oscillator 103, for example a crystal oscillator, and a temperature sensor 104 for sensing the temperature experienced by the oscillator 103. In some embodiments the temperature sensor 104 may be a thermistor.

It will be appreciated that while the oscillator has been depicted as a crystal oscillator 103 in this embodiment, the oscillator may be any suitable means for generating a frequency signal. The temperature sensor 104 may be coupled to the oscillator 103 and may be provided as a separate component to the oscillator. In other words, the oscillator and the temperature sensor do not have to be integrated as a single component for example like a TCXO.

The acquisition and tracking block 101 may receive a GNSS satellite signal at 105. It will be appreciated that this signal 105 may not be received directly from a transmitter such as a satellite, but may be first processed by other circuitry in or associated with the receiver 100. For example, the signal 105 may be down-converted and/or pre-processed for noise.

The compensator 102 may receive a frequency signal 106 from the oscillator 103, an indication of temperature 107 from the temperature sensor 107 and an offset 108.

The frequency compensator 102 may make use of a model that models the relationship between an indication of the temperature of the oscillator and the amount of compensation to be applied to the frequency generated by the oscillator at that temperature. It will be appreciated that this may be indicative of a relationship between the frequency generated by the oscillator and the temperature of the oscillator. In other embodiments, this model may further be indicative of a non-linear relationship between a temperature sensor value and temperature.

The frequency compensator 102 may compensate a frequency generated by the oscillator 103 based on this model and the received indication of temperature to provide a predicted frequency 109. The predicted frequency 109 may be used in the acquisition and tracking of the GNSS signal. The frequency compensator 102 may also update the accuracy of the model based on the offset 108.

The offset 108 may be a measurement of a difference between the predicted frequency 109 and the target frequency. It will be appreciated that the target frequency is the frequency that oscillator would generate under ideal conditions. In this case, the frequency of the GNSS signal may be considered to be the target frequency. The offset 108 may be considered to be an indication of a prediction or compensation error or inaccuracy of the frequency compensator 102.

In operation, the oscillator 103 may be designed or expected to generate a signal having a first frequency component. The oscillator may be expected to generate this signal under ideal conditions. In this regard, the first frequency component may be considered to be a target frequency of the oscillator 103.

In some embodiments, the first frequency component may correspond to a frequency of a received GNSS signal 105. The frequency of the GNSS signal may be close to a frequency generated under ideal conditions as this signal may be received from satellite or terrestrial stations in which highly accurate (and expensive) oscillators are implemented.

Due to environmental and/or manufacturing factors however, the oscillator 103 of the GNSS receiver may generate a signal having the first frequency component and a second frequency component. The second frequency component may correspond to a frequency error due to non-ideal behavior of the oscillator 103.

The frequency of the signal generated by the oscillator 103 may therefore comprise a first component corresponding to the target frequency and a second component corresponding to an error component due to non-ideal conditions of the oscillator. The oscillator 103 may then provide this frequency to the frequency compensator 102.

In the meantime, the receiver 100 may receive a GNSS signal 105. The frequency of the GNSS signal may correspond to the first frequency component of the frequency generated by the oscillator 103. The GNSS signal may not comprise the second component of the oscillator frequency due to the type of oscillator used to generate the GNSS signal. For example, the GNSS signal may be generated by a satellite having a highly accurate oscillator. It will however be appreciated that the frequency of the GNSS signal may not be exactly equal to the first frequency component, however it will be a good approximation of the first frequency component.

It will be appreciated that the frequency of the GNSS signal may also comprise non-ideal components. However, for signal acquisition, the frequency generated by the oscillator and frequency compensator should be as close to the received GNSS signal frequency as possible. By setting the frequency of the GNSS signal as the target frequency, the frequency compensator may also take into account the non-ideal component of the GNSS frequency. It will, however, be appreciated that in some embodiments the non-ideal frequency components of the GNSS frequency may be negligible.

The frequency compensator 102 may predict the target frequency based on an indication of the temperature of the oscillator and the model An offset 108 between the predicted frequency 109 generated by the frequency compensator 102 and the target frequency represented by the frequency of the GNSS signal 105 may be determined and provided to the frequency compensator 102. It will be appreciated that in some embodiments, instead of receiving the offset 108 the frequency compensator may carry out this determination itself. In other embodiments, this offset may be determined elsewhere.

The offset 108 may indicate an error in the prediction/compensation model as the predicted frequency and the target frequency may not correspond. This lack of correspondence may indicate that the prediction of the target frequency is not entirely mitigating the effects of the second frequency component or, in other words, is not entirely accurate. The offset 108 may be used to update the model.

The compensator 102 therefore receives an indication of the temperature at which the oscillator is functioning and uses this to predict the target frequency. The compensator 102 may predict the target frequency by compensating the frequency generated by the oscillator 103 for the second or non-ideal frequency component.

The compensator 102 may further receive or determine an offset 108 between the predicted frequency 109 and target frequency and update the coefficients of a model used to predict the frequency.

The frequency compensator 102 may use a model corresponding to an expected frequency error of the oscillator for a given temperature. This frequency error may correspond to an amount of compensation to be applied to the oscillator frequency. For example, at higher temperatures, the model may predict a larger error or second frequency component. The model may predict a compensation that should be applied to the frequency generated by the oscillator 103 in order to bring that frequency closer to the target frequency.

In some embodiments the model may correspond to a function, for example a polynomial but not restricted to such, that models the behavior of the oscillator under different temperature conditions. Specifically the function may describe the compensation required under different conditions. The function may be described by a set of coefficients and these coefficients may be updated based on the offset 108.

The function may be implemented in the form of a filter. In the example of a filter, the filter may comprise two aspects. A first aspect may relate to the compensation of the frequency of the oscillator. In this case, the filter is used to predict a target frequency based on the current temperature of the oscillator. This prediction may be used to apply compensation to the oscillation frequency. In other words, the prediction mode or aspect of the filter may be used to compensate the oscillator frequency for non-ideal frequency behavior due to the temperature conditions of the oscillator.

The second mode or aspect of the filter is configured to update coefficients of the filter. An offset 108 may be determined by comparing the predicted frequency with a target frequency. The target frequency may be provided by a frequency of a GNSS signal 105. The offset may be used to update the filter coefficients. The second mode or aspect may be considered to be an updating mode of the filter and may comprise the predicting, comparison and update.

Figure 2:
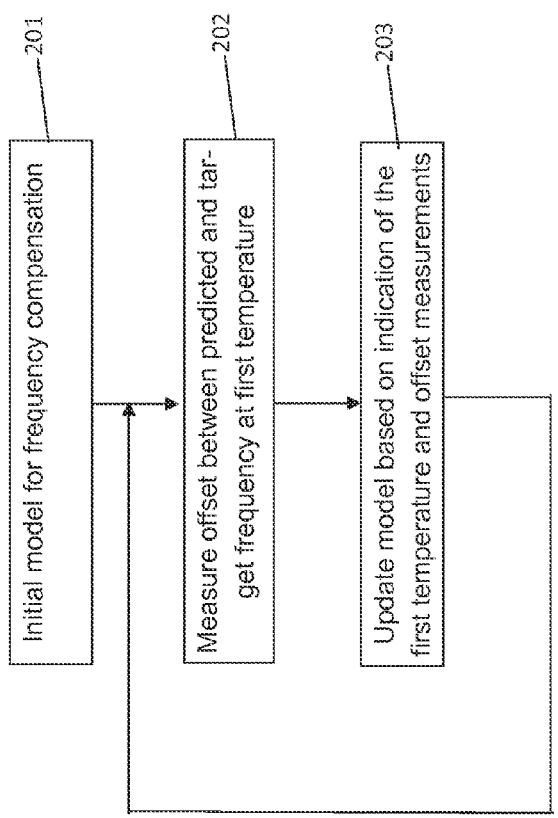
FIG. 2 is a flow diagram depicting the method steps of some embodiments.

FIG. 2 shows an example of the method steps that may be carried out to update the model in accordance with some embodiments.

At step 201 of FIG. 2, the compensator 102 has an initial model for frequency compensation. It will be appreciated that his initial model may be generated by a theoretical approximation of the expected behavior of the oscillator and/or may be generated from actual measurements from other receivers. It will, however, be appreciated that this initial model may not be entirely accurate as each oscillator 103 may have independent characteristics due to environmental factors and manufacturing differences.

At step 202, an offset between the frequency predicted by the frequency compensator and the target frequency, for example a frequency of the GNSS signal, is measured at a first temperature of the oscillator.

At step 203, the model of the relationship of an indication of temperature of the oscillator to the deviation of the predicted frequency from the target frequency may be updated to take into account these new data points.

After step 203, the method may loop back to step 202 where more measurements may be performed. It will be appreciated that these measurements may be performed periodically or at certain times specific to the receiver 100.

In one example, in some embodiments, these measurements may be performed about every 1 minute but it could be on any time scale dependent on the system implemented. A balance is to have a time period allowing for the temperature to change while still capturing data (generated frequency) at key temperature points. In some embodiments, the time period may be a range from 10 second to 1 minute. In some cases, there is some degradation in performance over the lifetime of the crystal oscillator. In some embodiments, this may be accounted for by the frequency compensator algorithm configured to forget the long term history of the data points. For example, the algorithm may only take into account the N last data points.

It will be appreciated that in some embodiments, the method of FIG. 2 may include the step of the frequency compensator 102 using the model and the received frequency from the oscillator 103 to compensate the received frequency from the oscillator 103 to provide the predicted frequency 109.

One way of using data points to update the amount of compensation applied to a frequency is to store the data points in a table and reference them. For example, the data points giving a prediction error of the model may be used to adjust a prediction of the model by looking up an adjustment value in the table. However, the use of such a table is potentially inaccurate and may take up extra space in memory as well as additional computational steps.

In embodiments of the present application, the model is implemented by a real-time, recursive algorithm in which data points are input to the model and cause the model coefficients to be updated. In this case, no table of data points need be stored. In such algorithms the data points may be filtered, resulting in an update of the coefficients of the filter.

Such an algorithm may be for example a linear quadratic estimation algorithm or a Kalman filter. In this case, the Kalman filter or linear quadratic estimation may be used to provide a model defined by coefficients. The coefficients of the model may describe the behavior of the oscillator frequency with regards to the temperature of the oscillator.

In the initial model, the coefficients may describe a not entirely accurate approximation of the behavior. The Kalman filter may provide an algorithm that accepts a series of data points comprising the measured temperature and offset and use these data points to provide more accurate estimations of the coefficients. The Kalman filter of embodiments may operate recursively and process each data point as it is generated. In other words, in some embodiments, the data points need not be stored in a table, but may be processed by the Kalman filter to update the coefficients as the data points are generated. The Kalman filter may operate recursively.

Figure 3:
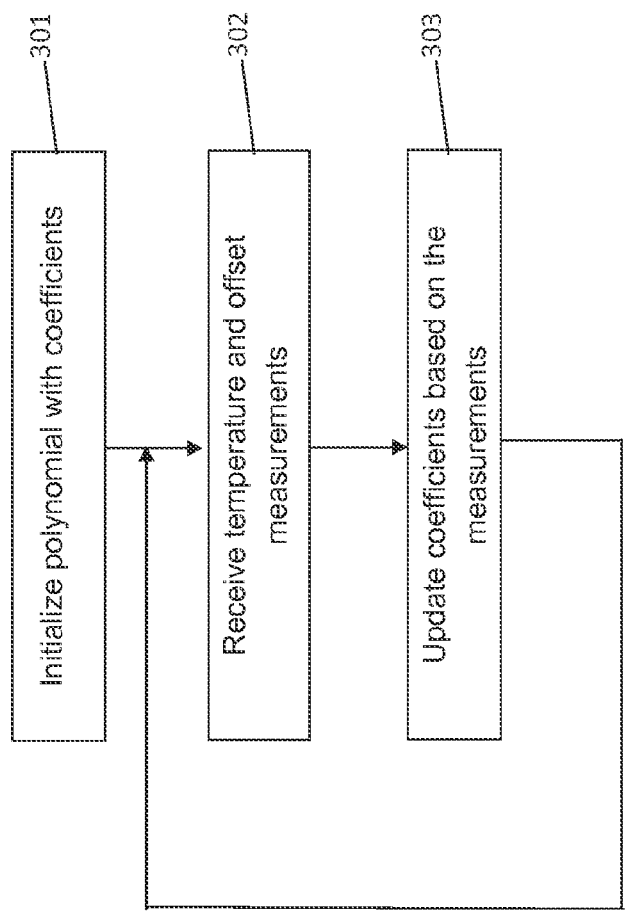
FIG. 3 is a method diagram depicting the method steps in accordance with further embodiments.

FIG. 3 shows an example of a method that may be implemented by the frequency compensator implemented by a Kalman filter. In this embodiment, the Kalman filter may comprise a model provided by a polynomial, however it will be appreciated that a function that fits the temperature behavior of the oscillator and/or thermistor may be implemented.

The Kalman filter may initialize with a polynomial having an initial set of coefficients. The polynomial may describe the behavior of an oscillator 103 to a theoretical approximation. For example, this initial polynomial may be determined explicitly by testing other oscillator's behavior under different temperate conditions. Alternatively or additionally the polynomial may be determined theoretically. In some cases the initial polynomial may be determined from information provided by a manufacturer of the oscillator. This initialization of a polynomial is shown at step 301.

At step 302, the filter may receive an indication of temperature and offset measurement. At step 303, the Kalman filter algorithm may be run with these measurements to update the coefficients of the polynomial.

The measurements may be received periodically or at set times and the method loops back to step 302. It will be appreciated that steps 302 and 303 may be carried out in response to an indication of temperature and offset measurement being received.

It will be appreciated that the use of a Kalman filter having a model corresponding to a polynomial is in accordance with one example of the present application. The frequency compensator 102 however may implement a model that takes into account both linear and non-linear behavior of the receiver.

For example in some embodiments a model described by coefficients may be used to additionally or alternatively compensate for non-linear error terms in the generated frequency. In other embodiments, these non-linear error terms may be compensated for in hardware attached to the oscillator and the filter may make use of a polynomial.

For example, referring back to the receiver 100 of FIG. 1, the temperature sensor 104 may be a thermistor. The thermistor 104 may be configured to generate an analog value that is representative of the temperature of the oscillator and that value may be digitized and sent to the frequency compensator 102 in some embodiments.

The relationship of the thermistor measurement however may not have a linear relationship to temperature. The relationship between the thermistor measurement and temperature may for example be described by an equation having coefficients provided by the manufacturer of the thermistor. These coefficients may have been determined for example theoretically and/or by explicitly testing, however they may not be completely accurate.

For example, the relationship between the thermistor and temperature may be described as follows:

$$RT = RT_0 e^{\beta\left(\frac{1}{T}-\frac{1}{T_0}\right)} \quad (i)$$

where RT is the value of thermistor or indication of the temperature;

T is current temperature of the thermistor; and $RT_0$, $\beta$ and $T_0$ are coefficients that may be provided by the manufacturer of the thermistor.

In some embodiments, the frequency compensator may take into account this non-linear behavior of the thermistor in its frequency compensation. For example, the model may model a relationship between a thermistor value RT and an amount of compensation to be applied to the frequency generated by the oscillator 103. The offset 108 may be used to update the model coefficients which may inherently take into account some of the non-ideal behavior of the thermistor.

In some embodiments, the model may therefore be implemented by a function that can account for the non-linear error component in the offset 108 due to the thermistor value and a linear component in the offset 108 due to the effect of temperature on the oscillator.

In another embodiment, the frequency compensator may implement two models—a first model describing the relationship between temperature and the oscillator frequency (for example a polynomial) and a second model (for example, based on equation (i)) describing the relationship between the thermistor value and temperature.

In this two model embodiment, the Kalman filter may separate the frequency error (for example, corresponding to the offset 108) into a number of error states based on the two functions describing the two models. The Kalman filter may separate the frequency error into the coefficients of the function describing the model relating to the oscillator behavior and separate the frequency error into coefficients for the function describing the model relating to the thermistor measurement inaccuracy. It will be appreciated that the Kalman filter can separate the frequency errors into different stated when the equations (the function describing the oscillator inaccuracy and the function describing the thermistor measurement inaccuracy) that relate the variables (error states) have different behavior at different temperatures and frequencies.

In some cases some of the relationship between the thermistor equation and the function describing the oscillator behavior may overlap and may not be separable unless extremes of temperature are reached. In this overlap, a single model for both behaviors may be used.

Figure 4:
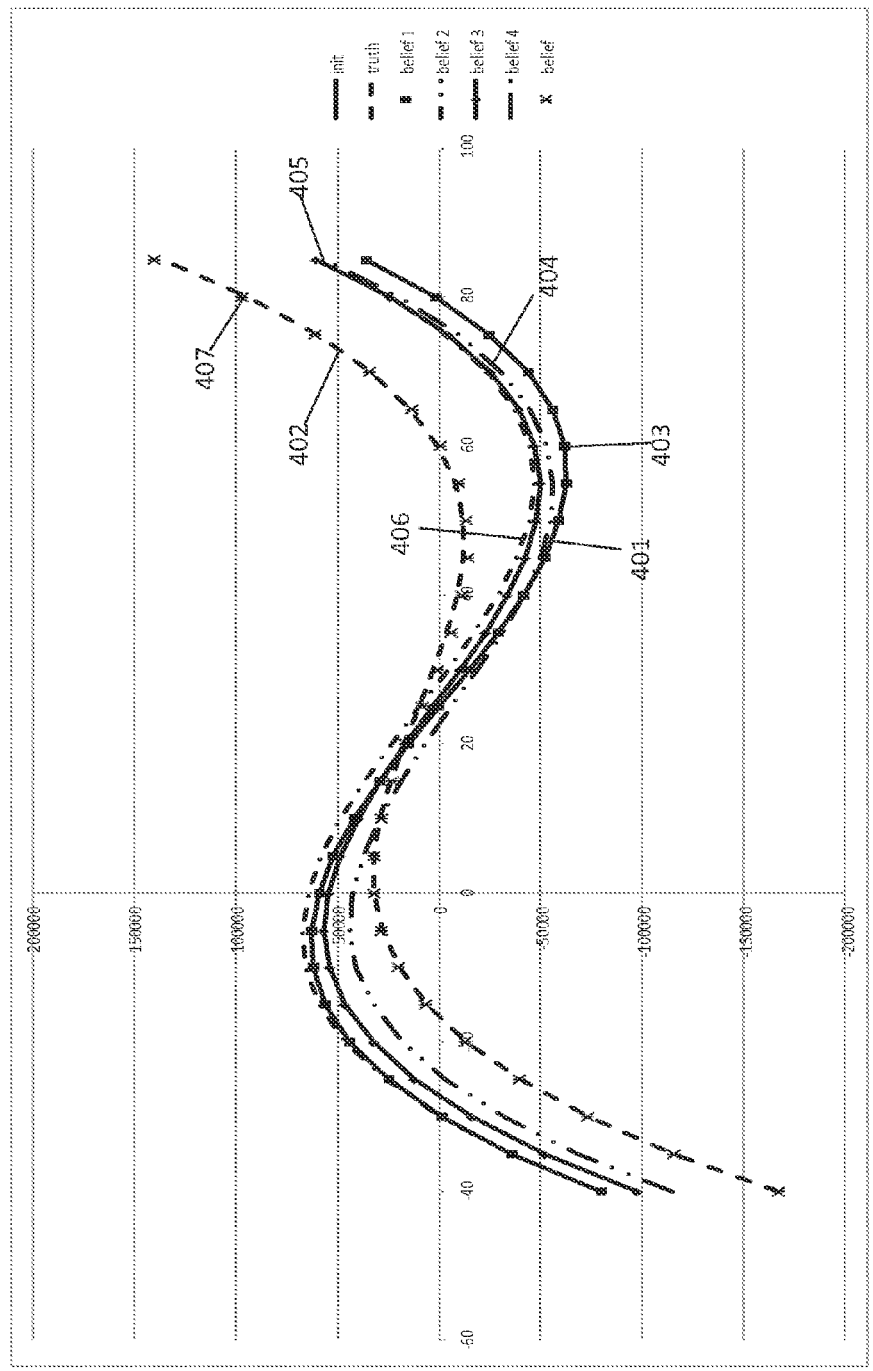
FIG. 4 is a graph showing the convergence of functions.

FIG. 4 shows a graph depicting an initial function and updated functions for describing the relationship of the frequency generated by the oscillator 103 with the indication of operating temperature of the oscillator 103.

FIG. 4 shows a plot of the initial function (init) 401 used at step 301. A function showing the actual behavior (truth) of the oscillator 103 is shown at 402. It can be seen that at an initial point of operation of the oscillator, the modeled behavior 401 is quite divergent from the actual behavior 402.

As the temperature and offset measurements are provided to the Kalman filter, the Kalman filter algorithm updates the initial function 401 to reflect the actual measurements made. Coefficients of the functions may be updated at the reception of each data point (temperature and offset measurement).

In addition to the initial function 401 and the actual behavior (truth) 402, FIG. 4 shows a first updated function 403, a second updated function 404, a third updated function 405, a fourth updated function 406 and a fifth updated function 407. Each function represents an updated version of a preceding function.

For example, FIG. 4 shows the progression of the modeled behavior represented by functions 403, 404, 405, 406 and 407 towards the actual behavior (truth) 402 of the oscillator.

The Kalman filter 102 may have an initial function 401 modeling the behavior of the oscillator 103. It will be appreciated that in further embodiments, this function may take into account temperature effects on the oscillator as well as non-linearity of the thermistor. This function may also in some embodiments be composed of two functions, one for the temperature effects on the oscillator and one for the non-linearity of the thermistor.

At step 302 a first data point comprising an indication of temperature and an offset may be received. The Kalman filter may update the coefficients of the initial function 401 in response thereto to provide a first updated function 403. As only one data point was available for the update, it can be seen that the first updated function 403 is similar to the initial function.

After a period of time or at a set point, the Kalman filter 102 may receive a second data point comprising a second temperature measurement and offset. The Kalman filter may update the coefficients of the first updated function 403 to reflect the new information in the form of the second data point. Updating the first updated function 403 creates a second updated function 404.

Similarly, when a third data point is received, the second updated function 404 is updated to provide a third updated function 405. When a fourth data point is received, the third updated function 405 is updated to create a fourth updated function 406. When a fifth data point is received, the fourth updated function 406 is updated to provide a fifth updated function 407.

It can be seen from FIG. 4 how, with the reception of new data points comprising temperature and offset information, the function used by the Kalman filter starts to converge on a function describing the actual real-world behavior of the oscillator and/or the thermistor measurement relationship to temperature. The fifth updated function 407 is closer to the actual model (truth) 402 than the initial function 401 as the fifth updated function 407 has taken into account further data points indicative of the oscillator and/or thermistor 103 behavior.

In this example, we describe each function 403, 404, 405 and 406 as being an update of the preceding function based on the reception of a data point, however it will be appreciated that each depicted function may be spaced two or more data points from the previously depicted function. For example, each function may be representative of two or more extra data points being received by the Kalman filter. The Kalman filter may process each data point as it is received to update the function.

Figure 5:
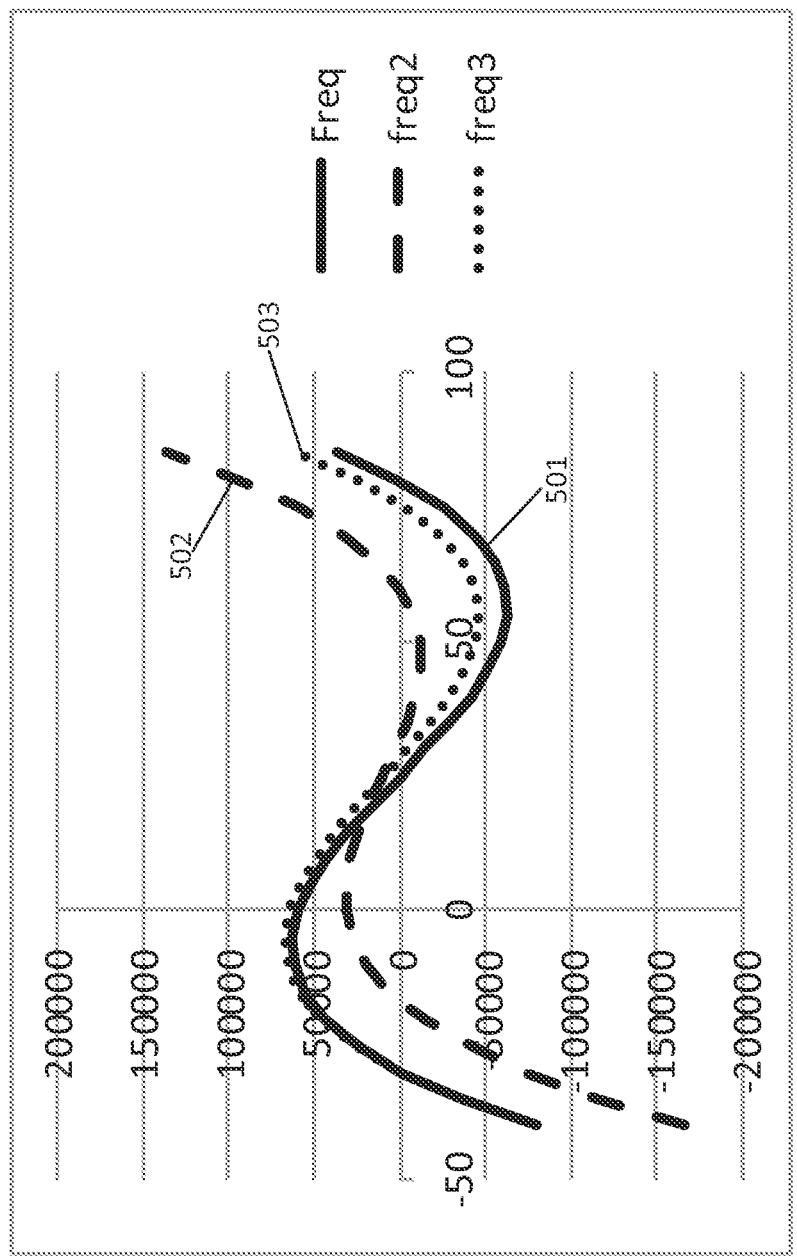
FIG. 5 is a graph showing the convergence of a compensated frequency.

FIG. 5 shows an example of a compensated frequency provided by the Kalman filter 102. FIG. 5 is a plot of amplitude against time for an ideal or expected frequency 501 (Freq), a first compensated frequency 502 (freq2) that was compensated using the initial function 401 and a second compensated frequency 503 (freq3) that was compensated using the fifth updated function 407. It can be seen that the by updating the function used by the Kalman filter 102, the compensated frequency starts to converge on the ideal or expected frequency.

Figure 6:
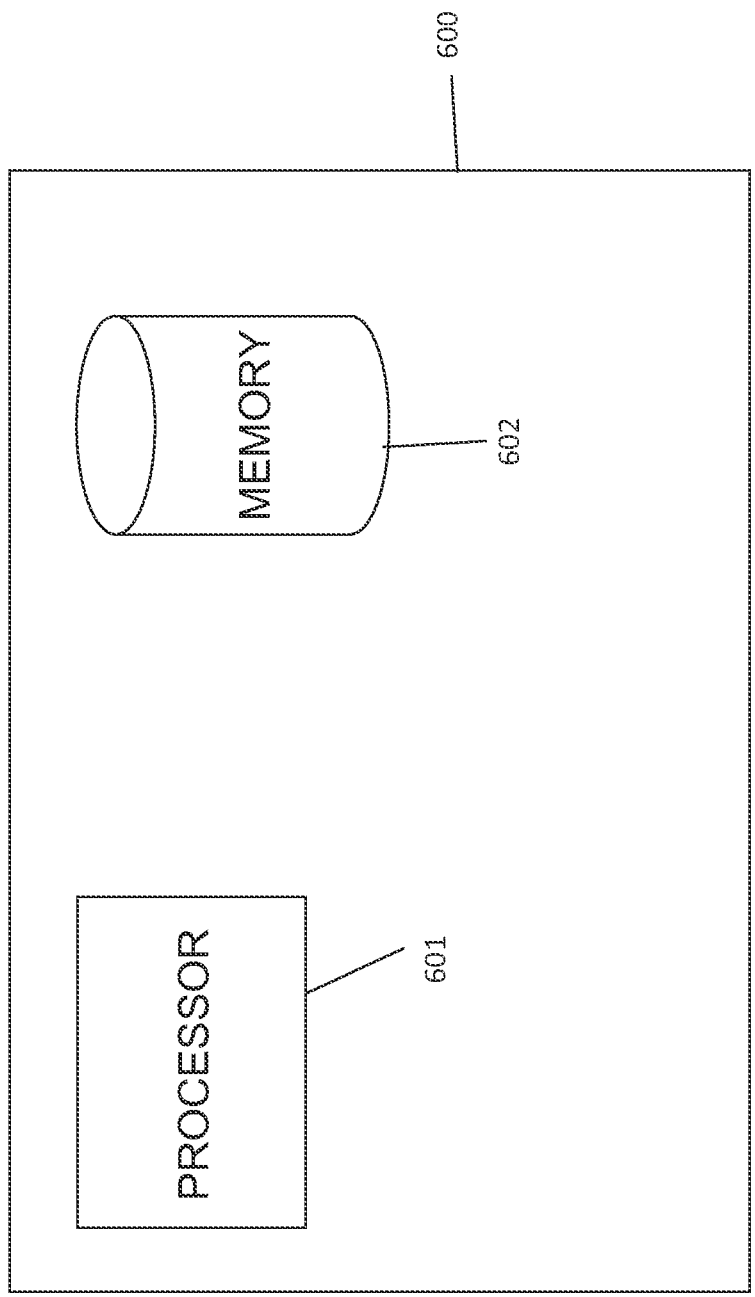
FIG. 6 is a schematic diagram showing the apparatus of some embodiments.

FIG. 6 shows an example of an apparatus according to some embodiments. The apparatus 600 may comprise a processor 601 and a memory 602. The processor 601 and memory 602 may be configured to implement the Kalman filter of some embodiments. The apparatus may include inputs for receiving one or more of an indication of temperature, offset, oscillator generated frequency and/or GNSS signal. It will be appreciated that in some embodiments, the apparatus may determine an offset based on the oscillator generated frequency and the GNSS frequency. In some embodiments, the apparatus may receive digitised versions of these inputs. In some embodiments the apparatus may carry out processing in accordance with a GNSS receiver. For example, the apparatus may further carry out tracking and acquisition and/or positioning determining operations in software.

It will be appreciated that while the foregoing has exemplified compensating a frequency for frequency errors due to temperature, in some embodiments, a frequency may be compensated based on other or additional environmental factors. For example the temperature sensor may be replaced by another environmental sensor.

It will be appreciated that embodiments of the present application may be incorporated in a GNSS receiver. For example a receiver in the GPS or Galileo global navigation satellite systems. In these embodiments, it will be appreciated that an apparatus according to some embodiments may include GNSS receiver hardware and be configured to carry out the functionality of a GNSS receiver based on the compensated frequency from the oscillator 103. It will be appreciated that such a GNSS receiver may for example be a stand-alone device or may be incorporated in another device, for example a mobile phone, laptop, tablet or other mobile computing device.

Referring back to FIG. 6, the apparatus 600 may include facilities/components, such as memory 602 and one or more processing unit(s) 601 suitable for carrying out the functions of the flow chart of FIG. 2 and/or 3 or the method steps described throughout this application. The components/facilities may be software, hardware or combinations thereof. It will be understood that within the apparatus 600 the modules and memory may be implemented in one or more physical or logical entities. The apparatus 600 may also comprise an input-output interface for receiving and/or sending the information.

It will be appreciated that in some embodiments, the oscillator may not be configured to generate a frequency that matches the frequency of the GNSS signal but rather be configured to generate a frequency that is a factor thereof. The oscillator hardware may be configured to scale this generated frequency to correspond to the expected frequency. It will be appreciated that in some embodiments, the oscillator may generate the expected frequency without any scaling. The expected frequency may be the frequency that is desired that the oscillator generates, for example the frequency required by the GNSS receiver for decoding. The expected frequency that is generated by the oscillator may comprise the first frequency component.

An appropriately adapted computer program code product or products may be used for implementing the embodiments, when loaded on an appropriate data processing apparatus, for example for compensating the frequency for error. The program code product for providing the operation may be stored on, provided and embodied by means of an appropriate carrier medium. An appropriate computer program can be embodied on a computer readable record medium. A possibility is to download the program code product via a data network. In general, the various embodiments may be implemented in hardware or special purpose circuits, software, logic or any combination thereof. Embodiments of the inventions may thus be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

It is also noted herein that while the above describes exemplifying embodiments of the invention, there are several variations and modifications which may be made to the disclosed solution without departing from the scope of the present invention.

What is claimed is:

1. An apparatus, comprising:
   an oscillator configured to generate a frequency signal;
   an environment sensor configured to generate an environmental signal relating to said oscillator;
   a filter block having a first input configured to receive the frequency signal, a second input configured to receive the environmental signal, a third input configured to receive an offset signal and an output, wherein the filter block has filter coefficients describing a relationship between the environmental signal and an amount of compensation applied to the frequency signal to generate a compensated frequency signal at the output, the filter configured to:
   predict the compensated frequency signal based on the environmental signal; and
   update the filter coefficients based on the offset signal, wherein the offset signal measures a frequency difference between the compensated frequency signal and a target frequency signal.

2. The apparatus of claim 1, wherein the filter block implements a Kalman filter.

3. The apparatus of claim 1, wherein the environmental signal provides an indication of a temperature at which the frequency signal is generated.

4. The apparatus of claim 1, wherein the filter block is configured to update the filter coefficients in real time.

5. The apparatus of claim 1, wherein the target frequency signal forms part of a global navigation satellite system signal.

6. The apparatus of claim 1, wherein the target frequency signal is received from a global navigation satellite system transmitter.

7. The apparatus of claim 1, wherein the filter coefficients are configured to describe a relationship between the compensated frequency signal and an indication of temperature based on the behavior of the oscillator and a thermistor as the environment sensor in response to temperature.

8. The apparatus of claim 1, wherein the apparatus is a component of a global navigation satellite system receiver.

9. An apparatus, comprising:
   an oscillator configured to generate a frequency signal; and
   a filter block having a first input configured to receive the frequency signal, a second input configured to receive an offset signal and an output, wherein the filter block filters the frequency signal in accordance with filter coefficients which describe a relationship between temperature and an amount of compensation applied to the frequency signal so as to generate a compensated frequency signal at the output;
   wherein said filter block is further configured to update said filter coefficients in response to said offset signal, wherein the offset signal is a frequency difference between the compensated frequency signal and a target frequency signal.

10. The apparatus of claim 9, further comprising a receiver circuit receiving a radio frequency signal, said target signal is at least derived from said received radio frequency signal, and wherein said receiver circuit processes the received radio frequency signal in response to said compensated frequency signal.

11. The apparatus of claim 9, wherein said filter coefficients are indicative of a relationship between temperature of the oscillator and the frequency signal generated by the oscillator.

12. The apparatus of claim 9, further comprising:
   a temperature sensor configured to sense oscillator temperature and generate a signal indicative thereof;
   said filter block including a further input for receiving said signal and further configured to generate said amount of compensation based on said signal.

13. The apparatus of claim 12, wherein said filter coefficients are indicative of a relationship between temperature and said signal generated by the temperature sensor.

14. The apparatus of claim 9, wherein the filter block implements a Kalman filter.

15. An apparatus, comprising:
   an oscillator configured to generate a first signal having a first frequency that differs from an ideal frequency due to temperature;
   a temperature sensor configured to sense temperature of the oscillator and generate a temperature signal;
   a filter configured to receive the first signal at the first frequency and generate a second signal at a second frequency, said filter applying filter coefficients which produce a compensation applied to the first signal in generating the second signal;
   wherein said filter coefficients are initially specified in response to said temperature signal; and
   wherein said filter is further configured to update said filter coefficients in real time while generating said second signal in response to an offset signal that is indicative of a frequency difference between the second frequency and the ideal frequency.

16. The apparatus of claim 15, wherein the filter is a Kalman filter.

17. The apparatus of claim 15, wherein said filter coefficients are indicative of:
   a relationship between temperature of the oscillator and the first signal generated by the oscillator; and
   a relationship between temperature and the temperature signal generated by the temperature sensor.

* * * * *